United States Patent
Ahmed et al.

(10) Patent No.: US 9,298,572 B2
(45) Date of Patent: Mar. 29, 2016

(54) BUILT-IN SELF TEST (BIST) WITH CLOCK CONTROL

(71) Applicants: Nisar Ahmed, Bee Cave, TX (US); Anurag Jindal, Patiala (IN); Nipun Mahajan, New Delhi (IN)

(72) Inventors: Nisar Ahmed, Bee Cave, TX (US); Anurag Jindal, Patiala (IN); Nipun Mahajan, New Delhi (IN)

(73) Assignee: Freescale Semiconductor, Inc., Austin, TX (US)

(*) Notice: Subject to any disclaimer, the term of this patent is extended or adjusted under 35 U.S.C. 154(b) by 74 days.

(21) Appl. No.: 13/967,337

(22) Filed: Aug. 14, 2013

(65) Prior Publication Data

US 2014/0281778 A1 Sep. 18, 2014

Related U.S. Application Data

(63) Continuation of application No. 13/826,347, filed on Mar. 14, 2013, now abandoned.

(51) Int. Cl.
*G01R 31/28* (2006.01)
*G06F 11/27* (2006.01)
*G01R 31/3177* (2006.01)
*G01R 31/3185* (2006.01)
*G01R 31/3187* (2006.01)
*G01R 31/317* (2006.01)

(52) U.S. Cl.
CPC ............ *G06F 11/27* (2013.01); *G01R 31/3177* (2013.01); *G01R 31/3187* (2013.01); *G01R 31/31727* (2013.01); *G01R 31/318552* (2013.01)

(58) Field of Classification Search
CPC .............. G01R 31/3187; G01R 31/318555; G06F 11/27; G11C 29/16; G11C 29/44
See application file for complete search history.

(56) References Cited

U.S. PATENT DOCUMENTS

| | | | |
|---|---|---|---|
| 6,442,722 B1 | 8/2002 | Nadeau-Dostie | |
| 6,516,432 B1 * | 2/2003 | Motika et al. | 714/732 |
| 6,934,921 B1 | 8/2005 | Gu | |
| 6,961,886 B2 * | 11/2005 | Motika et al. | 714/732 |
| 7,183,825 B2 | 2/2007 | Padhye | |
| 7,269,780 B2 | 9/2007 | Arima | |
| 7,278,078 B2 * | 10/2007 | Hii et al. | 714/733 |
| 7,284,175 B2 * | 10/2007 | Wang et al. | 714/727 |
| 7,366,965 B2 * | 4/2008 | Yamasaki et al. | 714/718 |
| 7,716,546 B2 * | 5/2010 | Le et al. | 714/729 |
| 7,796,445 B1 | 9/2010 | Biyani | |
| 7,934,134 B2 * | 4/2011 | Forlenza et al. | 714/733 |
| 8,862,955 B2 * | 10/2014 | Cesari | 714/731 |

OTHER PUBLICATIONS

U.S. Appl. No. 13/826,347, Ahmed, Nisar, "Built-In Self Test (BIST) With Clock Control", Office Action—Rejection, mailed on Oct. 28, 2014.
Gu, X. et al., "An Effort-Minimized Logic BIST Implementation Method", IEEE International Test Conference (ITC), pp. 1002-1010, 2001.
Wood, T. et al., "The Test Features of the Quad-Core AMD Opteron Microprocessor", IEEE International Test Conference (ITC), pp. 1-10, 2008.

* cited by examiner

*Primary Examiner* — Esaw Abraham

(57) ABSTRACT

A processing system includes a clock generator circuit configured to receive a master clock signal and to output a plurality of clock signals, wherein the plurality of clock signals have a first frequency during a built-in self-test (BIST) mode and a plurality of shift-capture clock generator circuits. Each shift-capture clock generator circuit includes a clock gate circuit and a clock divider circuit and is configured to receive a corresponding one of the plurality of clock signals. At least one of the clock divider circuits changes the first frequency of the one of the plurality of clock signals to a second frequency during the BIST mode.

20 Claims, 3 Drawing Sheets

BUILT-IN SELF TEST (BIST) WITH CLOCK CONTROL

CROSS-REFERENCE TO RELATED APPLICATIONS

This application is a continuation of U.S. patent application Ser. No. 13/826,347 filed on Apr. 24, 2013, which is assigned to Freescale Semiconductor, Inc.

BACKGROUND OF THE INVENTION

This disclosure relates generally to integrated circuits having built-in self test (BIST) circuits, and more particularly, to BIST circuits with clock control.

Built-in self test (BIST), which refers to test circuitry on the same integrated circuit as the circuitry being tested, has become a very popular way to assist in testing an integrated circuit during normal testing plus providing effective testing even after the integrated circuit has been placed in a product. BIST allows for testing during normal operation, as well as using test patterns and other test techniques, in the operating environment in which the integrated circuit will spend its life as part of a product. The type of flexibility in the actual operating environment can result in a more effective test and also can be used for testing after a lengthy period of operation in which some aspects of the circuit may have declined. In such case, this can be used for early detection of a problem so that action can be taken before the problem results in a system failure. At the same time it is desirable for the BIST circuit to be efficient so as to not take up too much space and to provide flexibility in providing desirable tests. Even if ultimately the tests are fixed, the development of the tests may benefit from having the ability to be changed without changing the area occupied by the BIST circuitry and to avoid having to otherwise make significant changes to the BIST circuit in the process of finalizing its design.

Accordingly there is a need to improve upon one or more of the issues raised above in the context of BIST.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a shift-capture clock generator provides the needed frequency division using a master clock for outputting the desired clock signal without generating a separate clock at that needed frequency. This is better understood by reference to the drawings and the following description.

Figure 1:
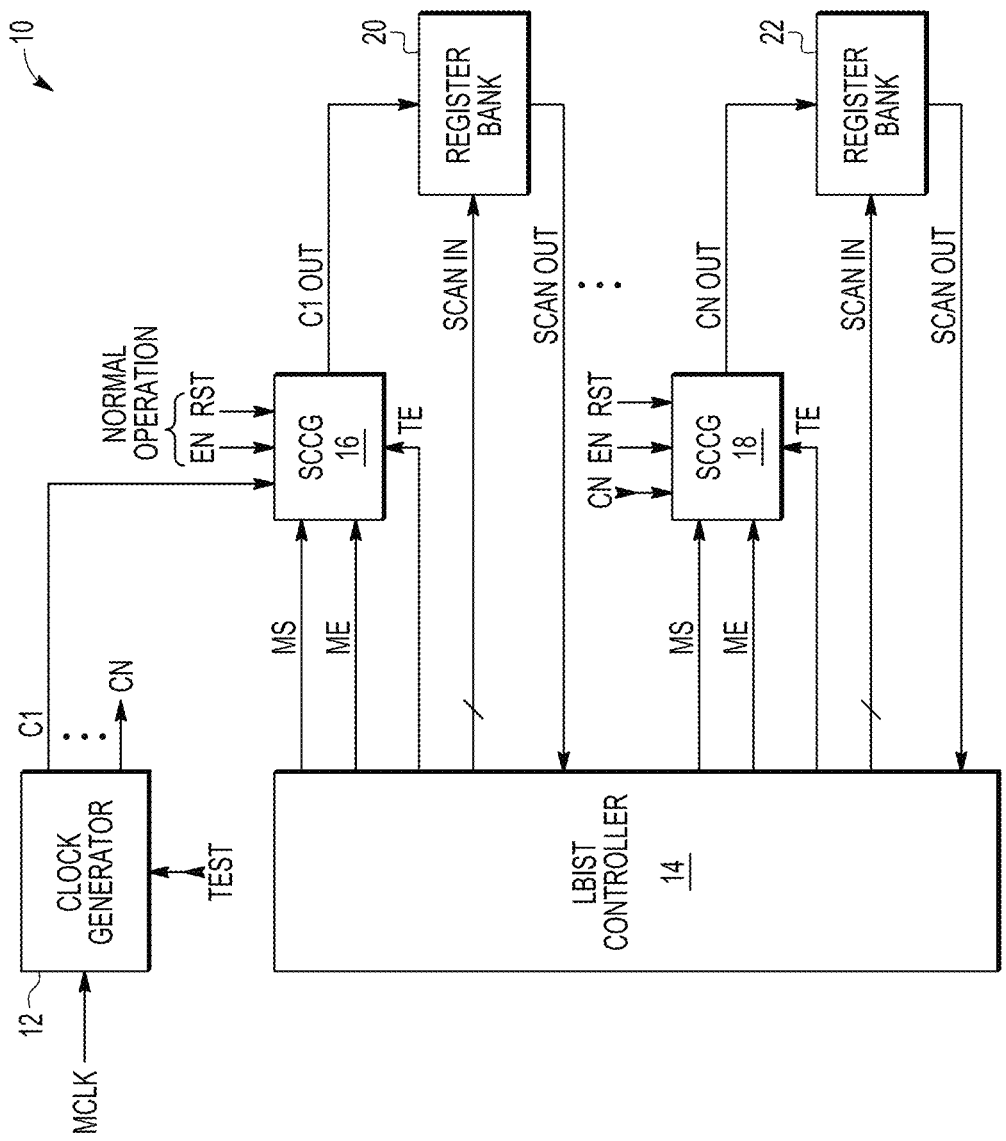
FIG. 1 is a block diagram of a portion of an integrated circuit having a BIST controller BIST, additional BIST circuitry, and circuits under test according to a first embodiment.

Shown in FIG. 1 is a processing system 10 comprising a clock generator 12, a logic built in self test (LBIST) controller 14, a shift-capture clock generator (SCCG) circuit 16, an SCCG circuit 18, a register bank 20, a register bank 22. Clock generator 12 receives a master clock MCLK and outputs a plurality of clocks shown as C1 and CN. SCCG circuit 16 receives an enable signal EN and a reset signal RST from a system processor not shown; a mode select signal MS, a mode enable signal ME, and a test enable signal TE from LBIST controller 14; and provides a clock C1 OUT to register bank 20. Register bank 20 receives a scan in signal from LBIST controller 14 and provides a scan out signal to LBIST controller 14. SCCG circuit 18 receives an enable signal EN and a reset signal RST from the system processor not shown; a mode select signal MS, a mode enable signal ME, and a test enable signal TE from LBIST controller 14; and provides a clock CN OUT to register bank 22. Register bank 22 receives a scan in signal from LBIST controller 14 and provides a scan out signal to LBIST controller 14.

In operation, clock generator 12 responds to master clock MCLK to provide clocks, such as clocks C1 and CN. In normal operation, the clocks are provided at a frequency that may differ from master clock MCLK. These frequencies are based on the particular circuits that will be clocked by them. A group of circuits that function together closely and clocked by the same clock may be called a domain and such clocks may be called domain clocks and the frequency of the clock of the domain may be called a domain frequency. In a test mode, the clocks, such as clocks C1 and CN are provided at the frequency of master clock MCLK. Using clock C1 as exemplary of the clocks provided by clock generator, clock C1 is passed through SCCG 16 during normal operation of the integrated circuit that includes system 10. In a test mode of the integrated circuit, run under the control of LBIST controller 14, SCCG 16 receives clock C1 at the frequency of master clock MCLK and converts it to a desirable condition for a shift mode portion of a scan test of register bank 20 and to a different condition for a capture mode portion of the scan test.

For the shift mode portion of the scan test of register bank 20, clock C1 OUT is provided at a shift frequency that is determined by LBIST controller 14. For the case where the domain frequency of register bank 20 is equal to the frequency of master clock MCLK, clock C1 is provided with pulses having the same width as the half the period of master clock MCLK and at the shift frequency. This can be viewed as the pulse widths of master clock MCLK and clock C1 being the same. For the case of the frequency of master clock MLCK being greater than the shift frequency, clock C1 is provided at the shift frequency with a 50% duty cycle. Herein, the duty cycle percentage is the percentage of time a clock is a logic high. The shift portion is for loading register bank 20 and uses transfer of data directly between registers.

For the capture portion of the scan test of bank 20, clock C1 is provided at the domain frequency of register bank 20 for two cycles. The clock is otherwise held in a disabled condition for the duration of the capture portion. The first of the two cycles is for performing a launch and the second of the two cycles is for performing a capture. The capture portion is for testing the transfer of data between registers through logic outside the registers. Thus there is a launch to the logic for the first of the two cycles and then a capture to receive data from the logic for the second of the two cycles.

An SCCG in general may be described as providing two pulses during the capture portion that are provided at a test rate and two or more pulses during the capture portion at the domain frequency of the domain being tested.

Figure 2:
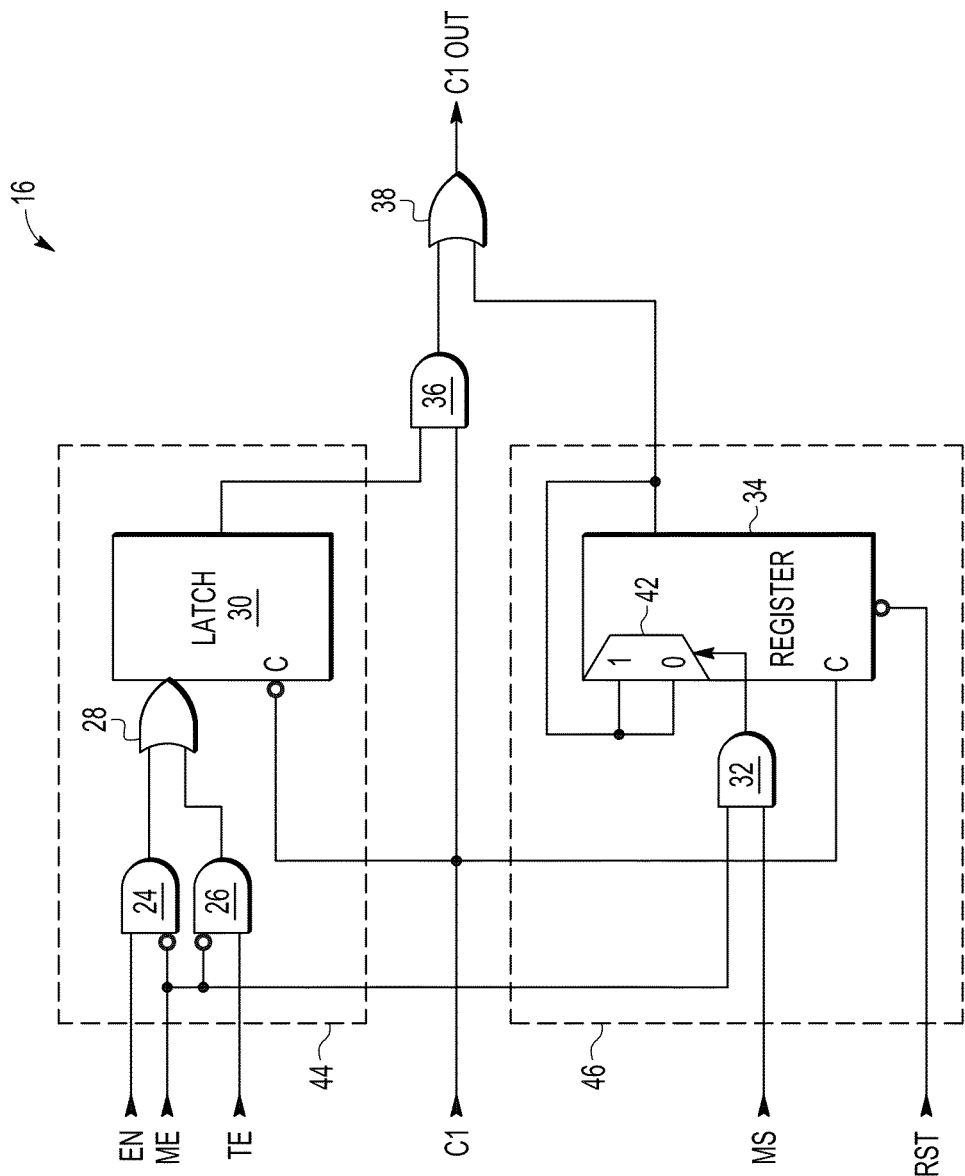
FIG. 2 is a logic diagram of an example of the additional BIST circuitry.

Shown in FIG. 2 is a combination block diagram and logic diagram of SCCG 16 comprising an AND gate 24, an AND gate 26, an OR gate 28, a latch 30, an AND gate 32, a shift register 34 with a multiplexer 42, an AND gate 36, and an OR gate 38. AND gate has a non-inverting input for receiving enable signal EN, an inverting input for receiving a mode enable signal ME, and an output. OR gate 28 has a first input connected to the output of AND gate 24, a second input connected to the output of AND gate 26, and an output. Latch 30 has an input connected to the output of OR gate 28, an inverting-clock input for receiving clock C1, and an output. AND gate 32 has a first input for receiving mode enable signal ME, a second input for receiving mode select signal MS, and an output. Multiplexer 42 has a control input connected to the output of AND gate 32, an inverting input and a non-inverting input connected to an output of register 34. AND gate 36 has a first input connected to the output of latch 30, a second input for receiving clock C1, and an output. OR gate 38 has a first input connected to the output of AND gate 36, a second input connected to the output of register 34, and an output for providing clock C1 OUT. AND gate 24, AND gate 26, OR gate 28, and latch 30 comprise a clock gate circuit 44. AND gate 32 and register 34, which includes multiplexer 42, comprise a clock divider circuit.

Figure 3:
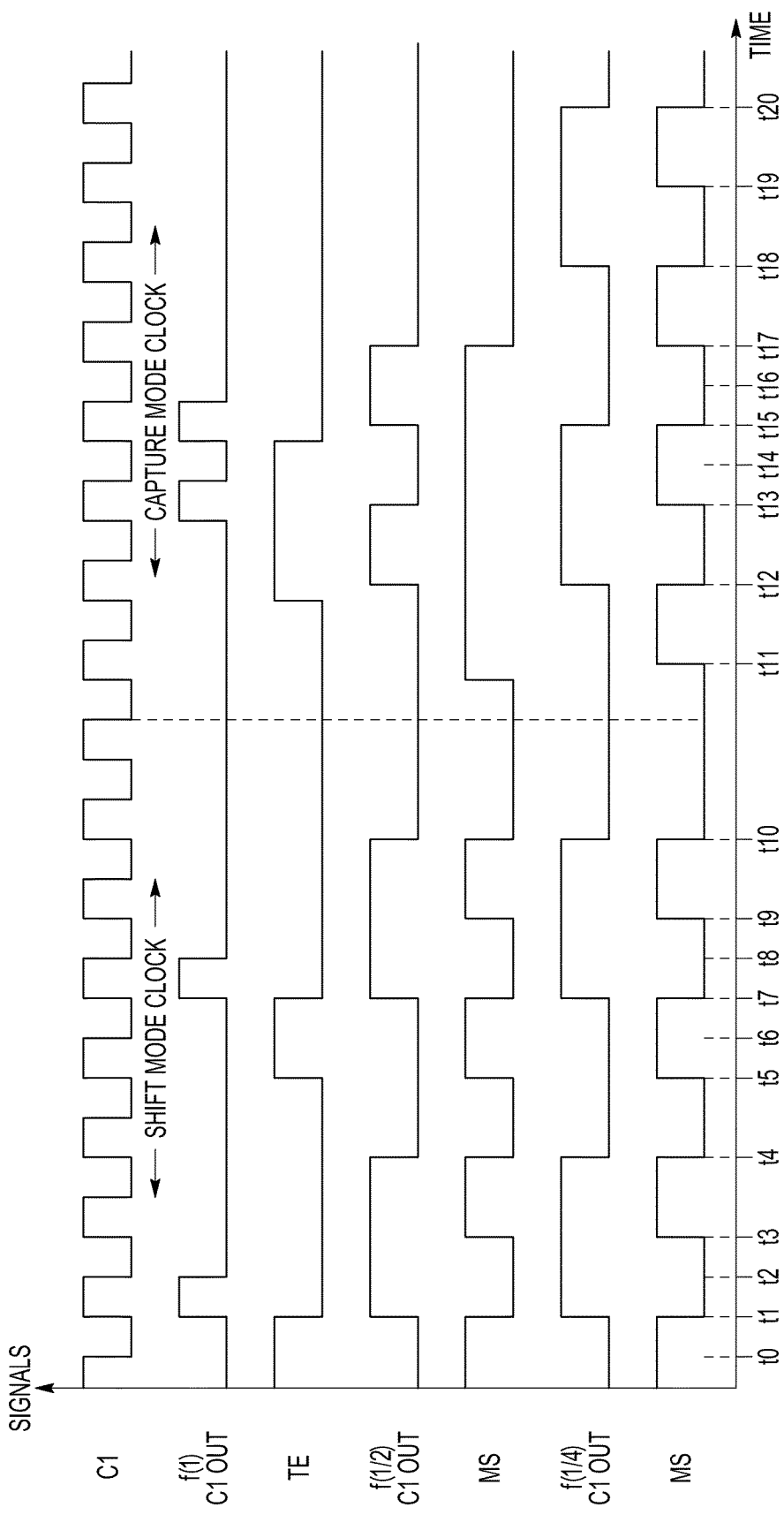
FIG. 3 is a timing diagram useful in understanding the operation of the BIST controller and the additional BIST circuitry.

Shown in FIG. 3 is a timing diagram of a shift mode portion and a capture mode portion of a scan test for three different domain frequencies for register bank 20; the same as master clock MCLK that is shown as f1, half the frequency of master clock MCLK that is shown as f1/2, and a fourth the frequency of master clock MCLK that is shown as f1/4.

In operation, when enable signal EN is a logic low, AND gate 24 is forced to provide a logic low output which results in OR gate being responsive to the output of AND gate 26. When mode enable signal ME is a logic high, AND gate 32 is responsive to mode select signal MS and the output of AND gate 26 is forced to a logic low due to the inverting input of AND gate receiving mode enable signal ME. With both inputs of OR gate 28 at a logic low, the input to latch 30 is a logic low which results in the output of latch 30 being at logic low which in turn forces AND gate 36 to provide a logic low output to OR gate 38. With the output of AND gate 36 at a logic low, OR gate 38 is responsive to the output of register 34. The output of register 34 is inverted if the output of AND gate 32 is a logic high when clock C1 switches to a logic high which may be referenced as a rising edge. The output of register 34 remains in its current state if the output of AND gate is a logic low. Reset signal RST at a logic high forces the output of register 34 to a logic low. The output of OR gate 38, which provides output signal C1 OUT, will follow the output of register 34 when the output of AND gate 36 is a logic low. Similarly, when the output of register 34 is a logic low, output signal C1 OUT will follow the output of AND gate 36.

Three examples of domain frequencies for a register bank, such as register bank 20, are shown in FIG. 3 using clock C1 in a test mode; the same frequency as the master clock shown as (f1), half the frequency of master clock MCLK shown as (f1/2), and a fourth the frequency of master clock MCLK shown as (f1/4). In the cases of (f1/2) and f1/4), reset signal RST switches from a logic low to a logic high to begin the shift mode so that the output of register 34 is initially a logic low and then becomes responsive to clock C1 and the output of AND gate 32. In effect, clock gate circuit 44 is disabled for the cases where the domain frequency is less than the master clock frequency and the clock divider circuit is disabled when the domain frequency and the master clock frequency are the same.

For the case of the domain frequency being the same as the master clock MCLK frequency, which is the case shown as (f1), test enable signal TE switches to a logic high prior to a time t0, which begins the generation of the shift mode clock, with enable signal EN at a logic low, mode enable signal ME at a logic low, mode select signal MS at a logic low, and reset signal RST at a logic high. Register 34 provides a logic low output to OR gate 38. With enable signal EN at a logic low, AND gate provides a logic low output. With mode enable signal ME at a logic low and test enable signal TE at a logic high, AND gate 26 is providing a logic high output at time t0. OR gate 28 responds by providing a logic high output to latch 30. At time t0, clock C1 switches to a logic low which both causes latch 30 to provide a logic high output to AND gate 36. With clock C1 switching to a logic low, AND gate 36 has one logic high and one logic low input so provides a logic low output. OR gate 38 thus continues to provide clock C1 OUT as a logic low. At time t1, clock C1 switches to a logic high and test enable signal TE switches to a logic low. The logic low of test enable signal TE causes the output of OR gate 28 to switch to a logic low but latch 30 continues to provide a logic high output. AND gate 36 responds by providing a logic high to OR gate 38 which in turn responds by providing a clock C1 OUT as a logic high. With test enable signal TE switching to a logic low, AND gate 26 provides a logic low output which is what causes OR gate 28 to be providing a logic low to latch 30. At time t2, clock C1 switches to a logic low causing AND gate 36 to provide a logic low to OR gate 38 which in turn causes OR gate 38 to provide clock C1 OUT at a logic low. Thus Clock C1 OUT is provided at a logic high between times t1 and t2 which is the same as the duration of a logic high of its clock at the domain frequency when its domain frequency is the same frequency as the master clock MCLK. Also in response to the falling edge of clock C1, latch 30 provides a logic low to AND gate 36. Latch 30 will continue to provide a logic low to AND gate 36 until the falling edge of clock C1 that occurs after the next time test enable signal TE switches to a logic high.

As shown in FIG. 3, the next time test enable signal TE switches to a logic high is prior to time t6, which is a falling edge of clock C1, and after the immediately preceding falling edge of clock C1. As shown in FIG. 3, the time of test enable signal TE switching to a logic high is at time t5. As described when test enable signal switched to a logic high at time t5, the result is that the output of OR gate 28 is a logic high prior to time t6, the next falling edge of clock C1. When clock C1 switches to a logic low at time t6, latch 30 provides a logic high to AND gate 36. Thus when clock C1 switches to a logic high at time t7, the output of AND gate 36 switches to a logic high and OR gate 38 responds by providing clock C1 OUT at a logic high. Test enable signal TE switches to a logic low which causes OR gate 28 to provide a logic low to latch 30. When clock signal C1 switches to a logic low at time t8, AND gate 36 responds by switching its output to a logic low and OR gate responds by providing clock C1 OUT at a logic low. Latch 30, with OR gate 28 outputting a logic low, provides a logic low in response to the falling edge of clock C1 which is maintained for the remainder of the shift mode clock because test enable signal TE remains a logic low for the remainder of the shift mode clock. With test enable signal TE at a logic low, OR gate 28 will output a logic low so that latch 30 will continue to provide a logic low. The time between t1 and t7 is the period of the shift frequency. A single pulse of C1 OUT is provided within one cycle of the shift mode clock. In this example, the shift mode clock frequency is one fourth of the frequency of master clock MCLK. Thus for every 4 pulses of clock C1 there is one pulse of C1 OUT.

As shown in FIG. 3, the capture mode clock follows the shift mode clock without changing any of the inputs except for test enable signal TE. During the capture mode clock, two pulses are generated in two cycles of the domain frequency. In this case the domain frequency is the same as master clock MCLK so that two pulses of clock C1 OUT are aligned with two pulses of clock C1 beginning at time t13. The initiation of this begins with test enable signal TE switching to a logic high prior to the falling edge of clock C1 that immediately precedes time t13. In this case, time t12, which aligns with the rising edge of clock C1 that immediately precedes time t13, is shown as the time test enable signal TE switches to a logic high. With signal TE switching to a logic high, the output of OR gate 28 switches to a logic high. Upon the falling edge between times t12 and t13 of clock C1, latch 30 switches its output to a logic high. With clock C1 switching to a logic low, AND gate 36 continues providing a logic low output. Thus clock C1 OUT also remains at a logic low. At time T13, when clock C1 switches to a logic high, AND gate 36 then has a logic high on both inputs so provides a logic high output, and OR gate 38 responds with a logic high output for clock C1 OUT. This logic high output continues until clock C1 switches to a logic low which causes the output of AND gate 36 to switch to a logic low which causes OR gate 38 to provide clock C1 OUT at a logic low. Signal TE is retained at a logic high so that the output of OR gate 28 remains at a logic high. Thus latch 30 retains its output at a logic high in response to the falling edge of clock C1 at time t14. After this falling edge of clock C1, test enable signal TE may switch to a logic low and must do so before the next falling edge of clock C1 which is time t16. Upon the next rising edge of clock C1 at time t15, AND gate 36 provides a logic high output which causes OR gate 38 to provide a logic high output as clock C1 OUT. Clock C1 OUT remains a logic high until clock C1 switches to a logic low at time t16. Prior to time t16, test enable signal TE switches to a logic low which is shown occurring at time t15. With test enable TE at a logic low at time t16, OR gate 28 is providing a logic low output to latch 30 at the falling edge of clock C1 so that latch 30 provides a logic low output at time t16. Test enable signal TE remains a logic low for the rest of the capture mode clock. The capture mode clock can be considered ended when the second pulse has been provided which for the (f1) case is at time t16. This shows that the rising edges and the falling edges of the two pulses are apart by the same amount of time as the cycle time of the domain clock which is the same as master clock MCLK in this (f1) case.

For the cases where the domain frequency is less than the master clock frequency, such as the (f1/2) and the (f1/4) cases, mode enable ME is a logic high so that the outputs of AND gates 26 and 24 are both a logic low so that the output of latch 30 is a logic low during both the shift mode and the capture mode clocks. Thus AND gate 36 provides a logic low output for the (f1/2) and (f1/4) cases and OR gate 38 thus provides the logic state of the output of register 34 as the logic state of clock C1 OUT. Similarly, AND gate provides its output at the logic state of mode select signal MS to the control input of multiplexer 42 of register 34. In operation, register 34 provides the output of multiplexer 42 in response to the rising edge of clock C1 at its output. For both the (f1/2) and (f1/4) cases, the initial conditions at time t0 as shown in FIG. 3 are clock C1 at logic low, mode select MS at a logic high, and the output of register 34 is set to a logic low by reset RST signal at a logic low. Reset signal RST is switched to a logic high before time t1. With register 34 providing a logic low output, clock C1 OUT is a logic low. With the output of AND gate 32 at a logic low, multiplexer 42 is selecting non-inverting input, which may be referenced as the non-inverting mode, to couple to its output upon the rising edge of its clock input which receives clock signal C1. The other condition of multiplexer 42 may be referenced as the inverting mode for register 34.

For the (f1/2) case, at time prior to t1 such as time t0, mode select MS is a logic high so that the output of AND gate 32 is a logic high. Recalling that the output is set initially at a logic low, when clock C1 switches to a logic high at time t1, mode select signal MS switches to a logic high causing multiplexer 34 to switch to the inverting mode so that and thus provide a logic high output so that OR gate 38 then provides clock C1 OUT as a logic high. Mode select signal MS switches to a logic low at time t1 so that AND gate 32 provides a logic low to register 34. At the next rising edge of C1 clock at time t3, register 34 switches to the non-inverting mode so that the output of register 34 remains at a logic high which in turns results in C1 OUT remaining a logic high. Mode select signal MS switches to a logic high at time t3 so that the output of AND gate 32 switches to a logic high output. At the next rising edge of C1 clock at time t4, clock C1 switches to a logic high which causes register 34 to switch to the inverting mode and provide a logic low output. With the output of register 34 switching to a logic low, OR gate 38 provides clock C1 OUT as a logic low. Mode select signal MS also switches to a logic low thus making the output of AND gate 32 provide a logic low output. At the next rising edge of clock C1 at time t5, register switches to the non-inverting mode and thus retains its output as a logic low which results in C1 OUT remaining at a logic low. Mode select signal MS switches to a logic high at time t5 which causes AND gate 32 to switch to a logic high. The next rising edge of clock C1 at time t7 causes register 34 to switch to inverting mode which causes register 34 to switch its output to a logic high and thus clock C1 OUT switches to a logic high. Mode select signal MS switches to a logic low at time t7. This operation continues until the end of the shift mode clock resulting in two pulses during the mode select clock with a 50 percent duty cycle. This is achieved by the frequency of the mode select signal being two times the frequency of the shift mode clock, mode select signal MS being a logic high prior to time t1 and then switching state at each subsequent rising edge of clock C1. Each cycle of mode select signal MS results in a transition of clock C1 OUT. The result is two pulses with the time between pulses being the same as the duration of the pulses. The time between time t1 and time t4 is the same as the time between t4 and time t7. Because the object in this case is that the duty cycle be 50%, the controlling frequency for the both the pulse width and the cycle length is the frequency of the shift mode clock The same is true for the (f1/4) case in which there are still simply two pulses per shift mode clock at a 50% duty cycle. Thus, for the shift mode clock, the process for the (f1/4) case is the same as for the (f1/2) case as shown in FIG. 3.

As for the capture mode clock for the (f1/2) case, prior to time t12, which can be time t11, which is one cycle of clock C1 prior to time t12, mode select signal MS switches to a logic high which causes AND gate 32 to output a logic high. As the initial condition, register 34 is outputting a logic low so that OR gate 38 is providing clock C1 OUT as a logic low. At time t12, the next rising edge of clock C1, register 34 switches to the inverting mode and thus provides a logic high output. Mode select signal MS remains at a logic high until time 17 which is a rising edge of clock C1 so that register 34 switches to the non-inverting mode and remains in the non-inverting mode for the remainder of the capture mode clock due to mode select signal remaining a logic low after time t17. With mode select signal MS at a logic high, register 34 remains in the inverting mode until time t17. With register 34 in the inverting mode, register 34 and thus clock C1 OUT switch logic state on each rising edge of clock C1. Thus C1 OUT switches to a logic low at time t13, a logic high at time t15, and then a logic low at time t17. Thus, from time t12 to time t17 two pulses are generated at the rate of one half the frequency of master clock MCLK which is the domain clock rate for the (f1/2) case.

For the (f1/4) case the domain clock rate is the same as the pulse rate for the shift mode clock. Thus the same process as used for the shift mode clock is used for the capture mode clock. The result is the desired two pulses at the domain frequency.

The capture mode clock provides two pulses in this example and provides the two pulses for the case where the pulses are provided at the same pulse width for the domain clock in the case of the domain clock having a 50 percent duty cycle. This is achieved by dividing the master clock inside the SCCG. That is to say clock C1 OUT is generated by clock divider circuit 46 to produce C1 OUT at a different frequency than the master clock frequency without actually needing another clock at the different frequency. Clock C1 OUT is generated at the domain frequency without requiring a separate clock at the domain frequency.

By now it should be appreciated that there has been provided a processing system having a clock generator circuit configured to receive a master clock signal and to output a plurality of clock signals, wherein the plurality of clock signals have a first frequency during a built-in self-test (BIST) mode. The processing system further includes a plurality of shift-capture clock generator circuits, each shift-capture clock generator circuit including a clock gate circuit and a clock divider circuit. Each of the shift-capture clock generator circuits is configured to receive a corresponding one of the plurality of clock signals. At least one of the clock divider circuits changes the first frequency of the one of the plurality of clock signals to a second frequency during the BIST mode. The processing system may further include a controller configured to generate a plurality of mode select signals and to provide a respective one of the mode select signals to each of the shift-capture clock generator circuits, wherein the mode select signal determines the second frequency. The processing system may have a further characterization by which a duration of a first half of a clock cycle at the second frequency is approximately the same as a duration of a second half of the clock cycle at the second frequency. The processing system may further include a controller configured to provide a mode enable signal to each of the shift-capture clock generator circuits and when the mode enable signal is in a first state, the clock gate circuit outputs the one of the plurality of clock signals as received by the shift-capture clock generator circuit and when the mode enable signal is in a second state, the clock gate circuit is disabled and the clock divider circuit outputs the one of the plurality of clock signals at the second frequency. The processing system may further include a controller configured to provide a test enable signal to each of the shift-capture clock generator circuits, wherein the test enable signal determines whether the shift-capture clock generator circuits are in the test mode. The processing system may further include the BIST mode includes a shift mode and a capture mode and the frequency of the plurality of clock signals is the second frequency during the shift mode. The processing system may further include the BIST mode includes a shift mode and a capture mode and frequencies of the plurality of clock signals are different during the capture mode. The processing system may further include each of the clock gate circuits output the corresponding one of the plurality of clock signals during a normal operation mode. The processing system may further include a controller coupled to the shift-capture clock generator circuits operable to control the second frequency of at least one test clock signal output by the shift-capture clock generator circuits during a scan test of a circuit under test. The processing system may further include at least a second one of the clock divider circuits changes the first frequency of the one of the plurality of clock signals to a third frequency during the BIST mode.

Also disclosed is an integrated circuit processing system including a plurality of shift-capture clock circuits, each shift-capture clock circuit having a clock gate circuit and a divider clock circuit and being coupled to receive one of a plurality of clock signals at a first frequency during a built-in self-test (BIST) mode. The clock gate circuits output a respective one of the plurality of clock signals when not in BIST mode. At least a first of the divider clock circuits outputs a first test clock signal at a second frequency during the BIST mode. At least a second of the divider clock circuits outputs a second test clock signal at a third frequency during the BIST mode. The integrated circuit processing system further includes a controller coupled to the shift-capture clock generator circuits operable to control the second and third frequencies during a scan test of a circuit under test. The integrated circuit processing system further includes a controller configured to generate a plurality of mode select signals and to provide a respective one of the mode select signals to each of the shift-capture clock generator circuits, wherein a first of the mode select signals determines the second frequency and a second of the mode select signals determines the third frequency. The integrated circuit processing system may have a further characteristic by which a duration of a first half of the first test clock signal at the second frequency is approximately the same as a duration of a second half of the first test clock signal at the second frequency. The integrated circuit processing system further includes a controller configured to provide a mode enable signal to each of the shift-capture clock generator circuits, wherein the mode enable signal controls whether the first and second of the clock divider circuits output the first and second test clock signals. The integrated circuit processing system further includes a controller configured to provide a test enable signal to each of the shift-capture clock generator circuits, wherein the test enable signal determines whether the shift-capture clock generator circuits are in the BIST mode. The integrated circuit processing system has a further characteristic by which the BIST mode includes a shift mode and a capture mode and the second frequency is the same as the third frequency during the shift mode. The integrated circuit processing system has a further characteristic by which the BIST mode includes a shift mode and a capture mode and the second and third frequencies are different during the capture mode.

Disclosed also is a method of generating clock signals during a built-in self-test (BIST) mode for an integrated circuit. The method includes receiving a master clock signal in a clock generator circuit. The method further includes receiving a control clock signal from a plurality of control clock signals from the clock generator circuit in a shift-capture clock circuit, wherein the plurality of control clock signals have a same frequency during the BIST mode. The method further includes, when in the BIST mode, changing the frequency of one of the control clock signals from the same frequency to a second frequency in a divider clock circuit of the shift-capture clock circuit. The method further includes, when not in the BIST mode, outputting the control clock signal using a clock gate circuit in the shift-capture clock circuit. The method may further include generating a mode select signal in a controller of the integrated circuit, wherein the mode select signal is coupled to the divider clock circuit to control the second frequency.

Although the invention is described herein with reference to specific embodiments, various modifications and changes can be made without departing from the scope of the present invention as set forth in the claims below. For example, the doping types are given for the example of a N channel type memory cell whereas it may be feasible to implement a P channel type memory cell in which case the doping types would be reversed as needed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A processing system comprising:
a clock generator circuit configured to receive a master clock signal and to output a plurality of clock signals, wherein the plurality of clock signals have a first frequency during a built-in self-test (BIST) mode; and
a plurality of shift-capture clock generator circuits, each shift-capture clock generator circuit including a clock gate circuit and a clock divider circuit, wherein:
each of the shift-capture clock generator circuits is configured to receive a corresponding one of the plurality of clock signals, and
at least one of the clock divider circuits changes the first frequency of the one of the plurality of clock signals to a second frequency during the BIST mode.

2. The system of claim 1, further comprising:
a controller configured to generate a plurality of mode select signals and to provide a respective one of the mode select signals to each of the shift-capture clock generator circuits, wherein the mode select signal determines the second frequency.

3. The system of claim 2, wherein a duration of a first half of a clock cycle at the second frequency is approximately the same as a duration of a second half of the clock cycle at the second frequency.

4. The system of claim 1, further comprising:
a controller configured to provide a mode enable signal to each of the shift-capture clock generator circuits, wherein
when the mode enable signal is in a first state, the clock gate circuit outputs the one of the plurality of clock signals as received by the shift-capture clock generator circuit, and
when the mode enable signal is in a second state, the clock gate circuit is disabled and the clock divider circuit outputs the one of the plurality of clock signals at the second frequency.

5. The system of claim 1, further comprising:
a controller configured to provide a test enable signal to each of the shift-capture clock generator circuits, wherein the test enable signal determines whether the shift-capture clock generator circuits are in the test mode.

6. The system of claim 1, further comprising:
the BIST mode includes a shift mode and a capture mode and the frequency of the plurality of clock signals is the second frequency during the shift mode.

7. The system of claim 1, further comprising:
the BIST mode includes a shift mode and a capture mode and frequencies of the plurality of clock signals are different during the capture mode.

8. The system of claim 1, further comprising:
each of the clock gate circuits output the corresponding one of the plurality of clock signals during a normal operation mode.

9. The system of claim 6, further comprising:
a controller coupled to the shift-capture clock generator circuits operable to control the second frequency of at least one test clock signal output by the shift-capture clock generator circuits during a scan test of a circuit under test.

10. The system of claim 1, wherein at least a second one of the clock divider circuits changes the first frequency of the one of the plurality of clock signals to a third frequency during the BIST mode.

11. An integrated circuit processing system comprising:
a plurality of shift-capture clock circuits, each shift-capture clock circuit having a clock gate circuit and a divider clock circuit and being coupled to receive one of a plurality of clock signals at a first frequency during a built-in self-test (BIST) mode, wherein
the clock gate circuits output a respective one of the plurality of clock signals when not in BIST mode,
at least a first of the divider clock circuits outputs a first test clock signal at a second frequency during the BIST mode, and
at least a second of the divider clock circuits outputs a second test clock signal at a third frequency during the BIST mode.

12. The system of claim 11, further comprising:
a controller coupled to the shift-capture clock generator circuits operable to control the second and third frequencies during a scan test of a circuit under test.

13. The system of claim 11, further comprising:
a controller configured to generate a plurality of mode select signals and to provide a respective one of the mode select signals to each of the shift-capture clock generator circuits, wherein a first of the mode select signals determines the second frequency and a second of the mode select signals determines the third frequency.

14. The system of claim 12, wherein a duration of a first half of the first test clock signal at the second frequency is approximately the same as a duration of a second half of the first test clock signal at the second frequency.

15. The system of claim 11, further comprising:
a controller configured to provide a mode enable signal to each of the shift-capture clock generator circuits, wherein the mode enable signal controls whether the first and second of the clock divider circuits output the first and second test clock signals.

16. The system of claim 11, further comprising:
a controller configured to provide a test enable signal to each of the shift-capture clock generator circuits, wherein the test enable signal determines whether the shift-capture clock generator circuits are in the BIST mode.

17. The system of claim 11, further comprising:
the BIST mode includes a shift mode and a capture mode and the second frequency is the same as the third frequency during the shift mode.

18. The system of claim 17, further comprising:
the BIST mode includes a shift mode and a capture mode and the second and third frequencies are different during the capture mode.

19. A method of generating clock signals during a built-in self-test (BIST) mode for an integrated circuit, the method comprising:
receiving a master clock signal in a clock generator circuit;
receiving a control clock signal from a plurality of control clock signals from the clock generator circuit in a shift-capture clock circuit, wherein the plurality of control clock signals have a same frequency during the BIST mode;
when in the BIST mode,
changing the frequency of one of the control clock signals from the same frequency to a second frequency in a divider clock circuit of the shift-capture clock circuit, and
when not in the BIST mode,
outputting the control clock signal using a clock gate circuit in the shift-capture clock circuit.

20. The method of claim 19 further comprising:
generating a mode select signal in a controller of the integrated circuit, wherein the mode select signal is coupled to the divider clock circuit to control the second frequency.

* * * * *